US009964720B2

United States Patent
Zheng et al.

(10) Patent No.: US 9,964,720 B2
(45) Date of Patent: May 8, 2018

(54) MONITORING AND CONTROLLING TEMPERATURE ACROSS A LASER ARRAY IN A TRANSMITTER OPTICAL SUBASSEMBLY (TOSA) PACKAGE

(71) Applicant: Applied Optoelectronics, Inc., Sugar Land, TX (US)

(72) Inventors: Jun Zheng, Missouri City, TX (US); Yi Wang, Katy, TX (US); I-Lung Ho, Sugar Land, TX (US); Chong Wang, Stafford, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 861 days.

(21) Appl. No.: 14/295,459

(22) Filed: Jun. 4, 2014

(65) Prior Publication Data
US 2016/0377822 A1 Dec. 29, 2016

(51) Int. Cl.
*G02B 6/42* (2006.01)
*H04J 14/02* (2006.01)
(Continued)

(52) U.S. Cl.
CPC ....... *G02B 6/4271* (2013.01); *G02B 6/12019* (2013.01); *G02B 6/2938* (2013.01);
(Continued)

(58) Field of Classification Search
CPC . H04B 10/506; H04B 10/572; H01S 5/02415; H01S 5/02453; H01S 5/12;
(Continued)

(56) References Cited

U.S. PATENT DOCUMENTS 4,030,047 A * 6/1977 Fletcher ............... G02B 7/008
359/820
4,786,132 A 11/1988 Gordon
(Continued)

FOREIGN PATENT DOCUMENTS

| KR | 20000049869 A | 8/2000 |
|---|---|---|
| KR | 20000051030 A | 8/2000 |
| WO | 03012936 A2 | 2/2003 |

OTHER PUBLICATIONS

Palmer, Christopher, "Diffraction Gratings—The Crucial Dispersive Component", The Baseline, reprinted from Spectroscopy, vol. 10, No. 2, Feb. 1995, pp. 14-15.
(Continued)

*Primary Examiner* — Thomas A Hollweg
*Assistant Examiner* — Mary A El Shammaa
(74) *Attorney, Agent, or Firm* — Grossman Tucker Perreault & Pfleger, PLLC; Norman S. Kinsella

(57) ABSTRACT

The temperature at different locations along a multiplexed laser array may be monitored by sensing temperature at two locations within a transmitter optical subassembly (TOSA) package housing the laser array. The temperature at the two locations is used to determine a temperature tilt across the laser array. Estimated temperatures may then be determined at one or more other locations along the laser array from the temperature tilt. The estimated temperature(s) may then be used to adjust the temperature proximate the other locations, for example, for purposes of tuning lasers at those locations along the laser array to emit a desired channel wavelength. The TOSA package may be used in an optical transceiver in a wavelength division multiplexed (WDM) optical system, for example, in an optical line terminal (OLT) in a WDM passive optical network (PON).

9 Claims, 5 Drawing Sheets

(51) Int. Cl.
| | |
|---|---|
| *H04B 10/50* | (2013.01) |
| *H04B 10/572* | (2013.01) |
| *H01S 5/024* | (2006.01) |
| *H01S 5/068* | (2006.01) |
| *G02B 6/12* | (2006.01) |
| *G02B 6/293* | (2006.01) |
| *H01S 5/00* | (2006.01) |
| *H01S 5/12* | (2006.01) |
| *H01S 5/022* | (2006.01) |
| *H01S 5/06* | (2006.01) |
| *H01S 5/40* | (2006.01) |

(52) U.S. Cl.
CPC ....... *G02B 6/29329* (2013.01); *G02B 6/4292* (2013.01); *H01S 5/0014* (2013.01); *H01S 5/02415* (2013.01); *H01S 5/02453* (2013.01); *H01S 5/06804* (2013.01); *H01S 5/12* (2013.01); *H01S 5/4025* (2013.01); *H04B 10/503* (2013.01); *H04B 10/506* (2013.01); *H04B 10/572* (2013.01); *H04J 14/02* (2013.01); *H04J 14/0256* (2013.01); *H01S 5/02216* (2013.01); *H01S 5/0612* (2013.01); *H01S 5/4087* (2013.01)

(58) Field of Classification Search
CPC ..... H01S 5/4025; H04J 14/02; H04J 14/0256; G02B 6/4246; G02B 6/4271; G02B 6/12019; G02B 6/2938; G02B 6/4269; G02B 6/29329; G02B 6/4272; G02B 6/4273
See application file for complete search history.

(56) References Cited

U.S. PATENT DOCUMENTS

| | | | |
|---|---|---|---|
| 5,042,898 A | 8/1991 | Morey et al. | |
| 5,499,256 A | 3/1996 | Bischel et al. | |
| 5,732,102 A | 3/1998 | Bouadma | |
| 5,757,828 A | 5/1998 | Ouchi | |
| 5,937,120 A | 8/1999 | Higashi | |
| 5,987,200 A | 11/1999 | Fleming et al. | |
| 6,111,999 A | 8/2000 | Espindola et al. | |
| 6,118,562 A | 9/2000 | Lee et al. | |
| 6,188,705 B1 | 2/2001 | Krainak et al. | |
| 6,192,170 B1 | 2/2001 | Komatsu | |
| 6,275,629 B1 | 8/2001 | Eggleton et al. | |
| 6,303,040 B1 | 10/2001 | Oh et al. | |
| 6,411,746 B1 | 6/2002 | Chamberlain et al. | |
| 6,480,513 B1 | 11/2002 | Kapany et al. | |
| 6,683,895 B2 | 1/2004 | Pilgrim et al. | |
| 6,741,629 B1 | 5/2004 | Garnache et al. | |
| 6,853,671 B2 | 2/2005 | Liu et al. | |
| 6,917,636 B2 | 7/2005 | Blauvelt et al. | |
| 6,920,159 B2 | 7/2005 | Sidorin et al. | |
| 7,027,469 B2 | 4/2006 | Sidorin et al. | |
| 7,899,105 B1 | 3/2011 | Hargis et al. | |
| 7,965,949 B1 | 6/2011 | Wach | |
| 8,750,710 B1* | 6/2014 | Hirt | H04B 10/25759 398/135 |
| 2001/0017960 A1 | 8/2001 | Terahara | |
| 2004/0114646 A1 | 6/2004 | Stewart et al. | |
| 2005/0123300 A1 | 6/2005 | Kim et al. | |
| 2006/0171649 A1 | 8/2006 | Hsieh et al. | |
| 2006/0215713 A1 | 9/2006 | Flanders et al. | |
| 2006/0262818 A1 | 11/2006 | Kumar et al. | |
| 2007/0133647 A1 | 6/2007 | Daiber | |
| 2007/0223552 A1 | 9/2007 | Muendel et al. | |
| 2007/0280695 A1 | 12/2007 | Li et al. | |
| 2008/0008473 A1 | 1/2008 | Kim et al. | |
| 2008/0031294 A1 | 2/2008 | Krishnamoorthy et al. | |
| 2008/0080864 A1 | 4/2008 | Bai | |
| 2008/0187325 A1 | 8/2008 | McCallion et al. | |
| 2008/0259972 A1 | 10/2008 | Heanue et al. | |
| 2008/0267246 A1 | 10/2008 | Volodin et al. | |
| 2009/0185586 A1 | 7/2009 | Jhung et al. | |
| 2010/0158057 A1* | 6/2010 | Lerner | G02B 6/4201 372/34 |
| 2010/0172650 A1 | 7/2010 | Deng et al. | |
| 2010/0208756 A1 | 8/2010 | Noh | |
| 2010/0232458 A1 | 9/2010 | Kim et al. | |
| 2010/0266283 A1 | 10/2010 | Beckett | |
| 2011/0135309 A1 | 6/2011 | Lee et al. | |
| 2012/0076505 A1 | 3/2012 | Azemati et al. | |
| 2012/0301156 A1* | 11/2012 | Thompson | G02B 6/4272 398/188 |
| 2013/0208745 A1* | 8/2013 | Sjolund | H01S 5/02248 372/34 |
| 2014/0161457 A1 | 6/2014 | Ho et al. | |
| 2014/0241726 A1* | 8/2014 | Ho | H01S 3/04 398/70 |

OTHER PUBLICATIONS

PCT International Search Report and Written Opinion dated Oct. 5, 2012 received in related PCT Application No. PCT/US2012/046902, 9 pgs.
PCT International Search Report and Written Opinion dated Oct. 22, 2012 received in corresponding PCT Application No. PCT/US2012/046912, 8 pgs.
Lee, San-Liang et al, "Trend and Applications of Tunable Semiconductor Lasers", Optoelectronic Materials and Devices II, Proc. of SPIE vol. 6782, 67821H, 2007, Taipei, Taiwan R.O.C., 10 pgs.
PCT International Search Report and Written Opinion dated Jun. 6, 2014 received in related PCT Application No. PCT/US2014/017583, 10 pgs.
U.S. Office Action dated Jun. 20, 2014, received in related U.S. Appl. No. 13/774,125, 19 pgs.
PCT International Search Report and Written Opinion dated Dec. 8, 2015, received in corresponding PCT Application No. PCT/US15/34148, 11 pgs.

* cited by examiner

MONITORING AND CONTROLLING TEMPERATURE ACROSS A LASER ARRAY IN A TRANSMITTER OPTICAL SUBASSEMBLY (TOSA) PACKAGE

TECHNICAL FIELD

The present disclosure relates to multiplexed laser arrays and more particularly, to monitoring and controlling temperature across a laser array in a transmitter optical subassembly (TOSA) package.

BACKGROUND INFORMATION

Fiber optic communications networks may increase the amount of information carried on an optical fiber by multiplexing different optical signals on different wavelengths using wavelength division multiplexing (WDM). In a WDM passive optical network (PON), for example, a trunk fiber carries optical signals at multiple channel wavelengths to and from an optical branching point and the branching point provides a simple routing function by directing signals of different wavelengths to and from individual subscribers. In this case, each subscriber may be assigned one or more of the channel wavelengths on which to send and/or receive data.

To transmit and receive optical signals over multiple channel wavelengths, an optical line terminal (OLT) in a WDM-PON may include a multi-channel transmitter optical subassembly (TOSA) and a multi-channel receiver optical subassembly (ROSA). One example of a TOSA includes a multiplexed laser array that combines multiple optical signals at multiple channel wavelengths. To provide the different channel wavelengths, tunable lasers may be used in the multi-channel TOSA and the wavelengths emitted by the tunable lasers change with changes in temperature. The desired accuracy or precision of the wavelengths in a WDM-PON often depends on the number and spacing of the channel wavelengths and may be controlled in the TOSA by controlling temperature. In a 100 G dense WDM (DWDM) system, for example, the temperature may need to be controlled within ±0.5° C. to maintain a wavelength precision of ±0.5 nm and the temperature range may need to be greater than 4° C. to provide the desired wavelength yield of the laser diodes.

One challenge with such OLT transceiver modules is providing adequate temperature control of the laser array in a relatively small space and with relatively low power consumption. One way to monitor temperature is to use a temperature sensor; however, the temperature at different locations within the TOSA package may not be uniform, for example, due to airflow within the TOSA package. Thus, monitoring the temperature of each of the multiple lasers within such a package, without using temperature sensors for each of the lasers, presents a unique challenge.

BRIEF DESCRIPTION OF THE DRAWINGS

These and other features and advantages will be better understood by reading the following detailed description, taken together with the drawings wherein.

DETAILED DESCRIPTION

The temperature at different locations along a multiplexed laser array may be monitored, consistent with embodiments described herein, by sensing temperature at two locations within a transmitter optical subassembly (TOSA) package housing the laser array. The temperature at the two locations is used to determine a temperature tilt across the laser array. Estimated temperatures may then be determined at one or more other locations along the laser array from the temperature tilt. The estimated temperature(s) may then be used to adjust the temperature proximate the other locations, for example, for purposes of tuning lasers at those locations along the laser array to emit a desired channel wavelength. The TOSA package may be used in an optical transceiver in a wavelength division multiplexed (WDM) optical system, for example, in an optical line terminal (OLT) in a WDM passive optical network (PON).

As used herein, "channel wavelengths" refer to the wavelengths associated with optical channels and may include a specified wavelength band around a center wavelength. In one example, the channel wavelengths may be defined by an International Telecommunication (ITU) standard such as the ITU-T dense wavelength division multiplexing (DWDM) grid. As used herein, "tuning to a channel wavelength" refers to adjusting a laser output such that the emitted laser light includes the channel wavelength. The term "coupled" as used herein refers to any connection, coupling, link or the like and "optically coupled" refers to coupling such that light from one element is imparted to another element. Such "coupled" devices are not necessarily directly connected to one another and may be separated by intermediate components or devices that may manipulate or modify such signals. As used herein, "thermally coupled" refers to a direct or indirect connection or contact between two components resulting in heat being conducted from one component to the other component.

Figure 1:
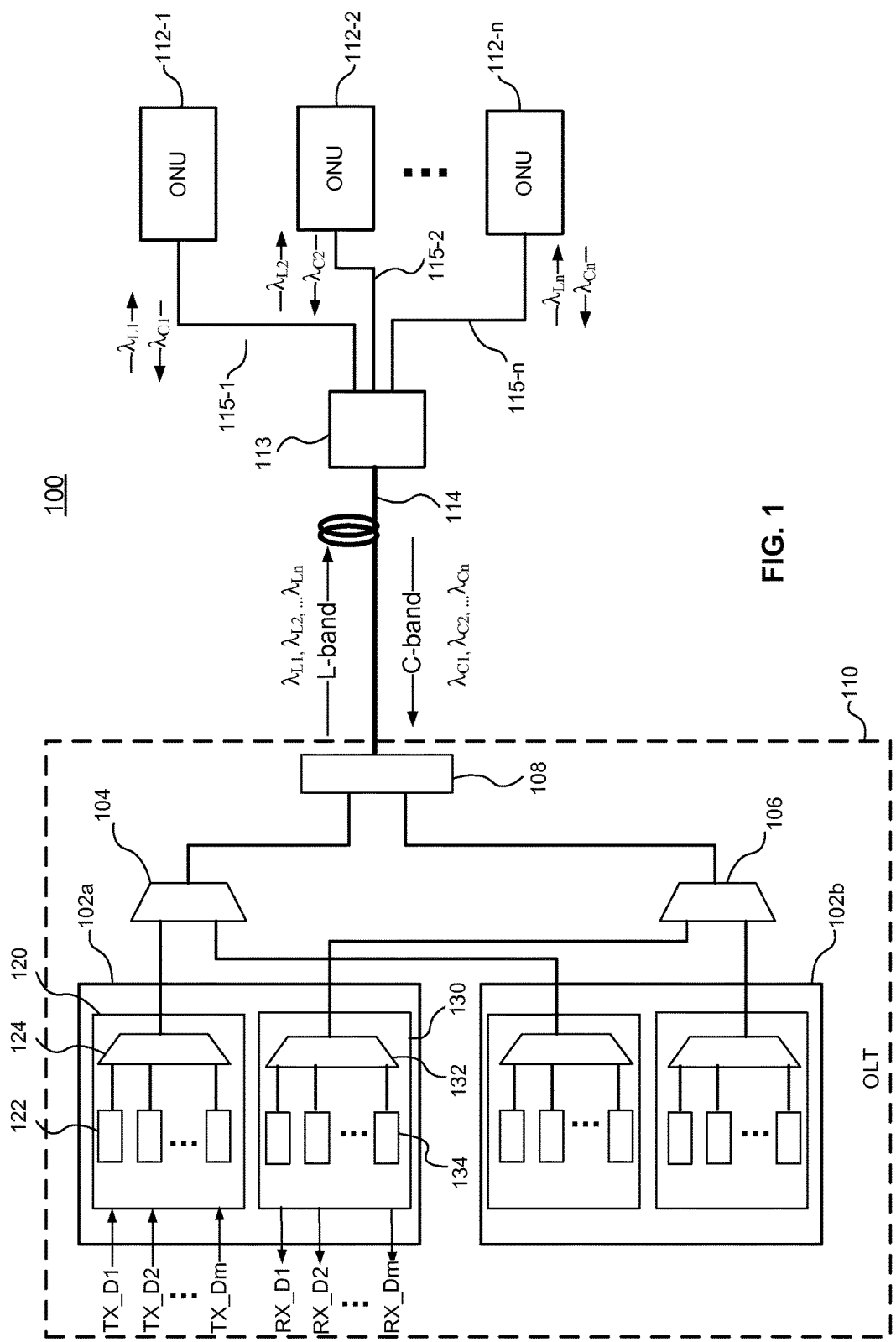
FIG. 1 is a functional block diagram of a wavelength division multiplexed (WDM) passive optical network (PON) including at least one multi-channel optical transceiver with temperature monitoring, consistent with embodiments of the present disclosure.

Referring to FIG. 1, a WDM-PON 100 including one or more multi-channel optical transceivers 102a, 102b may include a multiplexed laser array with temperature monitoring, consistent with embodiments of the present disclosure. The WDM-PON 100 provides a point-to-multipoint optical network architecture using a WDM system. According to one embodiment of the WDM-PON 100, at least one optical line terminal (OLT) 110 may be coupled to a plurality of optical networking terminals (ONTs) or optical networking units (ONUs) 112-1 to 112-n via optical fibers, waveguides, and/or paths 114, 115-1 to 115-n. Although the OLT 110 includes two multi-channel optical transceivers 102a, 102b in the illustrated embodiment, the OLT 110 may include one or more multi-channel optical transceivers.

The OLT 110 may be located at a central office of the WDM-PON 100, and the ONUs 112-1 to 112-n may be located in homes, businesses or other types of subscriber location or premises. A branching point 113 (e.g., a remote node) couples a trunk optical path 114 to the separate optical paths 115-1 to 115-n to the ONUs 112-1 to 112-n at the respective subscriber locations. The branching point 113 may include one or more passive coupling devices such as a splitter or optical multiplexer/demultiplexer. In one example, the ONUs 112-1 to 112-n may be located about 20 km or less from the OLT 110.

The WDM-PON 100 may also include additional nodes or network devices, such as Ethernet PON (EPON) or Gigabit PON (GPON) nodes or devices, coupled between the branching point 113 and ONUs 112-1 to 112-n at different locations or premises. One application of the WDM-PON 100 is to provide fiber-to-the-home (FTTH) or fiber-to-the-premises (FTTP) capable of delivering voice, data, and/or video services across a common platform. In this application, the central office may be coupled to one or more sources or networks providing the voice, data and/or video.

In the WDM-PON 100, different ONUs 112-1 to 112-n may be assigned different channel wavelengths for transmitting and receiving optical signals. In one embodiment, the WDM-PON 100 may use different wavelength bands for transmission of downstream and upstream optical signals relative to the OLT 110 to avoid interference between the received signal and back reflected transmission signal on the same fiber. For example, the L-band (e.g., about 1565 to 1625 nm) may be used for downstream transmissions from the OLT 110 and the C-band (e.g., about 1530 to 1565 nm) may be used for upstream transmissions to the OLT 110. The upstream and/or downstream channel wavelengths may generally correspond to the ITU grid. In one example, the upstream wavelengths may be aligned with the 100 GHz ITU grid and the downstream wavelengths may be slightly offset from the 100 GHz ITU grid.

The ONUs 112-1 to 112-n may thus be assigned different channel wavelengths within the L-band and within the C-band. Transceivers or receivers located within the ONUs 112-1 to 112-n may be configured to receive an optical signal on at least one channel wavelength in the L-band (e.g., $\lambda_{L1}$, $\lambda_{L2}$, ... $\lambda_{Ln}$). Transceivers or transmitters located within the ONUs 112-1 to 112-n may be configured to transmit an optical signal on at least one channel wavelength in the C-band (e.g., $\lambda_{C1}$, $\lambda_{C2}$, ... $\lambda_{Cn}$). Other wavelengths and wavelength bands are also within the scope of the system and method described herein.

The branching point 113 may demultiplex a downstream WDM optical signal (e.g., ($\lambda_{L1}$, $\lambda_{L2}$, ... $\lambda_{Ln}$) from the OLT 110 for transmission of the separate channel wavelengths to the respective ONUs 112-1 to 112-n. Alternatively, the branching point 113 may provide the downstream WDM optical signal to each of the ONUs 112-1 to 112-n and each of the ONUs 112-1 to 112-n separates and processes the assigned optical channel wavelength. The individual optical signals may be encrypted to prevent eavesdropping on optical channels not assigned to a particular ONU. The branching point 113 also combines or multiplexes the upstream optical signals from the respective ONUs 112-1 to 112-n for transmission as an upstream WDM optical signal (e.g., $\lambda_{C1}$, $\lambda_{C2}$, ... $\lambda_{Cn}$) over the trunk optical path 114 to the OLT 110.

The OLT 110 may be configured to generate multiple optical signals at different channel wavelengths (e.g., $\lambda_{L1}$, $\lambda_{L2}$, ... $\lambda_{Ln}$) and to combine the optical signals into the downstream WDM optical signal carried on the trunk optical fiber or path 114. Each of the OLT multi-channel optical transceivers 102a, 102b may include a multi-channel transmitter optical subassembly (TOSA) 120 for generating and combining the optical signals at the multiple channel wavelengths. The OLT 110 may also be configured to separate optical signals at different channel wavelengths (e.g., $\lambda_{C1}$, $\lambda_{C2}$, $\lambda_{Cn}$) from an upstream WDM optical signal carried on the trunk path 114 and to receive the separated optical signals. Each of the OLT multi-channel optical transceivers 102a, 102b may thus include a multi-channel receiver optical subassembly (ROSA) 130 for separating and receiving the optical signals at multiple channel wavelengths.

One embodiment of the multi-channel TOSA 120 includes a laser array 122, such as an array of laser diodes, which may be modulated by respective RF data signals (TX_D1 to TX_Dm) to generate the respective optical signals. The laser array 122 may be modulated using various modulation techniques including external modulation and direct modulation. An optical multiplexer 124, such as an arrayed waveguide grating (AWG), combines the optical signals at the different respective downstream channel wavelengths (e.g., $\lambda_{L1}$, $\lambda_{L2}$, ... $\lambda_{Lm}$). The temperature at various locations along the laser array 122 may be monitored and controlled, as described in greater detail below, to maintain a desired wavelength precision or accuracy.

The laser array 122 may include an array of laser diode chips or an array of gain chips that form external cavity lasers. In some embodiments, the laser array 122 may include tunable lasers that generate the optical signals at the respective channel wavelengths. In other embodiments, the laser array 122 may include lasers that generate optical signals over a band of channel wavelengths and filtering and/or multiplexing techniques may be used to produce the assigned channel wavelengths. Examples of optical transmitters including a laser array and AWG are disclosed in greater detail in U.S. patent application Ser. No. 13/543,310 (U.S. Patent Application Pub. No. 2013-0016971), U.S. patent application Ser. No. 13/357,130 (U.S. Patent Application Pub. No. 2013-0016977), and U.S. patent application Ser. No. 13/595,505 (U.S. Patent Application Pub. No. 2013-0223844), all of which are fully incorporated herein by reference. In the illustrated embodiment, the OLT 110 further includes a multiplexer 104 for multiplexing the multiplexed optical signal from the multi-channel TOSA 120 in the multi-channel transceiver 102a with a multiplexed optical signal from a multi-channel TOSA in the other multi-channel transceiver 102b to produce the downstream aggregate WDM optical signal.

One embodiment of the multi-channel ROSA 130 includes a demultiplexer 132 for separating the respective upstream channel wavelengths (e.g., $\lambda_{C1}$, $\lambda_{C2}$, ... $\lambda_{Cn}$). An array of photodetectors 134, such as photodiodes, detects the optical signals at the respective separated upstream channel wavelengths and provides the received data signals (RX_D1 to RX_Dm). In the illustrated embodiment, the OLT 110 further includes a demultiplexer 106 for demultiplexing the upstream WDM optical signal into first and second WDM optical signals provided to the respective multi-channel ROSA in each of the transceivers 102a, 102b. The OLT 110 also includes a diplexer 108 between the trunk path 114 and the multiplexer 104 and the demultiplexer 106 such that the trunk path 114 carries both the upstream and the downstream channel wavelengths. The transceivers 102a, 102b may also include other components, such as laser drivers, transimpedance amplifiers (TIAs), and control interfaces, used for transmitting and receiving optical signals.

In one example, each of the multi-channel optical transceivers 102a, 102b may be configured to transmit and receive 16 channels such that the WDM-PON 100 supports 32 downstream L-band channel wavelengths and 32 upstream C-band channel wavelengths. As mentioned above, the upstream and downstream channel wavelengths may span a range of channel wavelengths on the 100 GHz ITU grid. Each of the transceivers 102a, 102b, for example, may cover 16 channel wavelengths in the L-band for the TOSA and 16 channel wavelengths in the C-band for the ROSA such that the transceivers 102a, 102b together cover 32 channels. Thus, the multiplexer 104 may combine 16 channels from one transceiver 102a with 16 channels from the other transceiver 102b, and the demultiplexer 106 may separate a 32 channel WDM optical signal into two 16 channel WDM optical signals. According to one example of a multi-channel optical transceiver used in the WDM-PON 100, the desired wavelength precision or accuracy is ±0.05 nm, the desired operating temperature is between −5 and 70° C., and the desired power dissipation is about 16.0 W.

Figure 2:
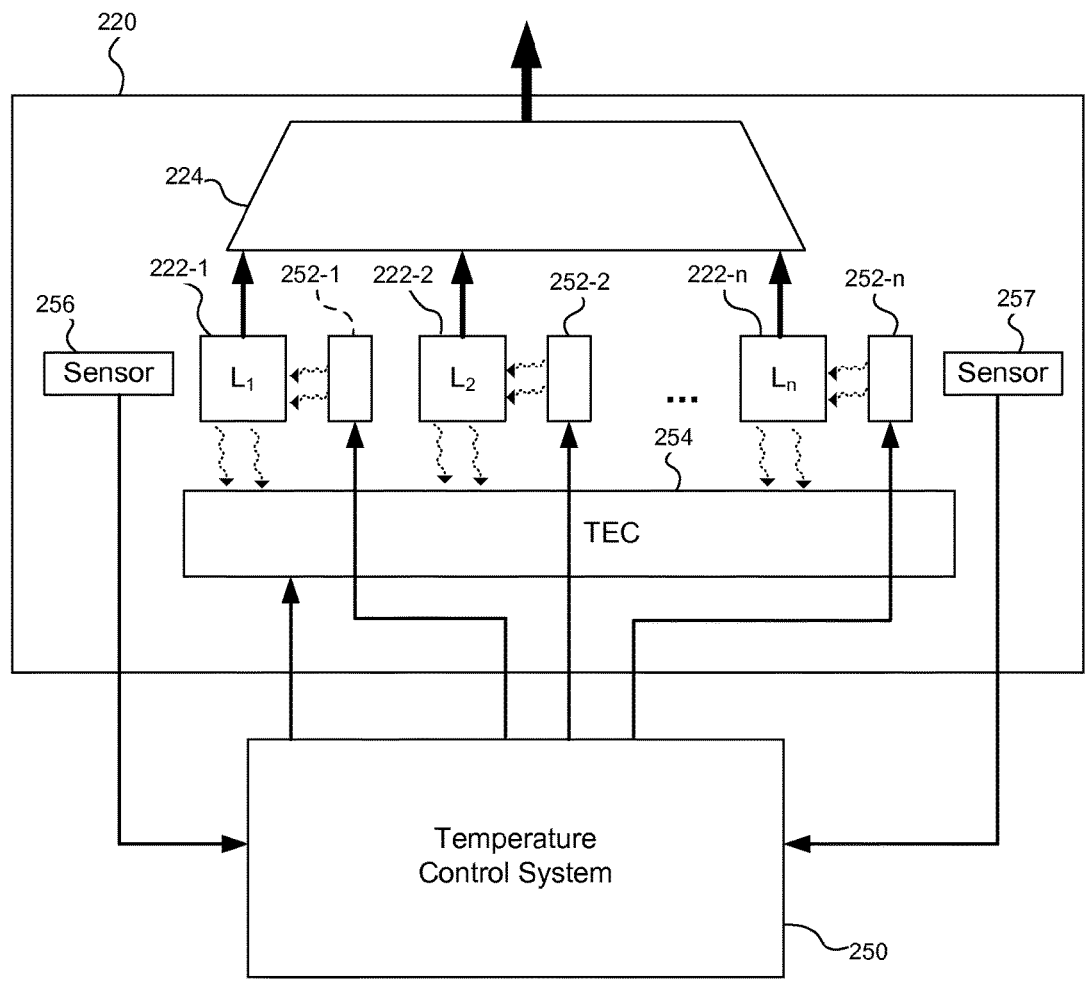
FIG. 2 is a diagrammatic view of a multi-channel TOSA with temperature monitoring within the TOSA package, consistent with an embodiment of the present disclosure.

Referring to FIG. 2, a system and method of monitoring temperature along different locations of a laser array within a temperature controlled multi-channel TOSA package 220 is described in greater detail. The TOSA package 220 generally includes an array of lasers 222-1 to 222-n and an optical multiplexer 224 that combines the laser light emitted from the lasers 222-1 to 222-n at the channel wavelengths. The lasers 222-1 to 222-n may include thermally tunable DFB laser diodes with a wavelength drift of about 0.1 nm/° C. and the optical multiplexer 224 may include an AWG. In one embodiment, the TOSA package 220 may include 16 lasers 222-1 to 222-n to provide 16 channels, although other embodiments may include other numbers of lasers. Although an array of lasers is shown, a laser array may include an array of any type of laser emitters including, for example, an array of gain chips or gain regions that form external cavity lasers.

The temperature controlled multi-channel TOSA package 220 further includes temperature control devices 252, 254 for controlling the temperature at different locations along the laser array. In this embodiment, the temperature control devices include heaters 252-1 to 252-n thermally coupled to the respective lasers 222-1 to 222-n to raise the local temperatures of the respective lasers and one or more coolers 254 thermally coupled to the lasers 222-1 to 222-n to lower the temperature of the lasers 122-1 to 122-n. The heaters 252-1 to 252-n may include resistors located adjacent the respective lasers 222-1 to 222-n. The cooler(s) 254 may include a thermoelectric cooler (TEC) coupled to all of the lasers 222-1 to 222-n. In the illustrated embodiment, one TEC is used to establish a global temperature for all of the lasers 222-1 to 222-n; however, separate micro TECs may be thermally coupled to each of the lasers. Although the illustrated embodiment provides both heating and cooling within the TOSA package, other embodiments may provide only heating or only cooling within the TOSA package to control the temperature.

Within the TOSA package 220, first and second temperature sensors 256, 257 sense first and second temperatures at first and second locations proximate first and second ends of the array of lasers 222-1 to 222-n. In the illustrated embodiment, the temperature sensors 256, 257 are shown before the first laser 222-1 and after the last laser 222-n in the laser array; however, the sensors 256, 257 may also be located in other locations, for example, after the first laser 222-1 and/or before the last laser 222-n. The temperature sensors may include thermistors or any other devices capable of sensing temperature and providing a signal representative of the sensed temperature.

Figure 2A:
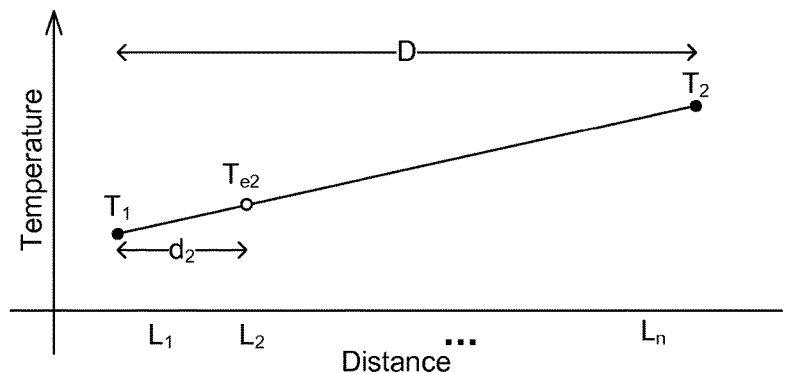
FIG. 2A is a chart illustrating temperature tilt across a laser array.

As illustrated in FIG. 2A, a temperature tilt may be determined from the temperature measurements ($T_1$, $T_2$) at the first and second locations. The temperature tilt represents a linear change in temperature as a function of distance from the first location or the second location. The temperature tilt (TT) may be determined, for example, by calculating the difference in the temperature measurements ($T_2-T_1$) divided by the distance (D) between the temperature sensors 256, 257 (e.g., $TT=T_2-T_1/D$). An estimated temperature may then be determined for the locations of any of the lasers 222-1 to 222-n using the temperature tilt and the known distances of the lasers from at least one of the temperature sensors 256, 257. An estimated temperature ($T_{e2}$) may be determined for the location of the second laser 222-2, for example, by multiplying the distance ($d_2$) of the second laser 222-2 from the first sensor 256 by the temperature tilt (TT) and adding to the first temperature ($T_1$) as follows: ($T_{e2}=TT*d_2+T_1$). Thus, the temperature of any location along the array of lasers 222-1 to 222-n may be accurately monitored even though the temperature may be non-uniform across the laser array and some of the lasers are spaced from the temperature sensors 256, 257.

Although the temperature tilt across the array of lasers 222-1 to 222-n may be determined using only two temperature sensors 256, 257, additional temperature sensors may be used in other locations within the TOSA package. Other methods of calculating the temperature tilt and the estimated temperatures may also be used.

A temperature control system 250 is coupled to the heaters 252-1 to 252-n, the cooler 254, and the temperature sensors 256, 257 for controlling the temperature at locations along the array of lasers 222-1 to 222-n in response to the monitored temperatures (e.g., the measured temperatures or the estimated temperatures). The temperature control system 250 may include any combination of circuitry, hardware, software, or firmware. The temperature control system 250 may be located, for example, on a circuit board in the transceiver containing the TOSA package (e.g., circuit board 308 shown in FIG. 3).

In operation, the temperature control system 250 receives signals from the temperature sensors 256, 257 and determines the first and second temperatures measured by the temperature sensors 256, 257. The temperature control system 250 calculates the temperature tilt from the measured first and second temperatures ($T_1$, $T_2$) and the known distance (D) between the temperature sensors 256, 257. The temperature control system 250 may then calculate estimated temperatures for the location of any of the lasers 222-1 to 222-n using the temperature tilt and the distance $d_n$ of the laser from one of the sensors 256, 257. The measured temperatures ($T_1$, $T_2$) may be used for the lasers (e.g., laser 222-1 and laser 222-n) that are proximate the temperature sensors 256, 257. The temperature control system 250 may then control the temperature control devices 252, 254 to adjust the local temperatures at the locations of the individual lasers in response to the monitored temperatures (i.e., the measured temperatures and/or estimated temperatures).

In some embodiments, each of the lasers 222-1 to 222-n may have a target temperature or temperature range, for example, corresponding to a desired wavelength emitted by the laser. The temperature control system 250 may adjust the temperatures at the locations of each of the lasers 222-1 to 222-*n* until the monitored temperatures reach the target temperatures or temperature ranges, for example, using feedback control loops.

In one example, the lasers 222-1 to 222-*n* may be thermally tuned to the channel wavelengths by establishing a global temperature for the array of lasers and separately raising local temperatures of individual lasers in response to the monitored temperatures. A temperature control device, such as a TEC cooler coupled to the laser array, may provide the global temperature, and individual heaters, such as resistors adjacent respective lasers, may provide the local temperatures. This type of wavelength tuning system is described in greater detail in U.S. patent application Ser. No. 13/774,125 (U.S. Patent Application Pub. No. 2014-0241726), which is fully incorporated herein by reference.

Figure 3:
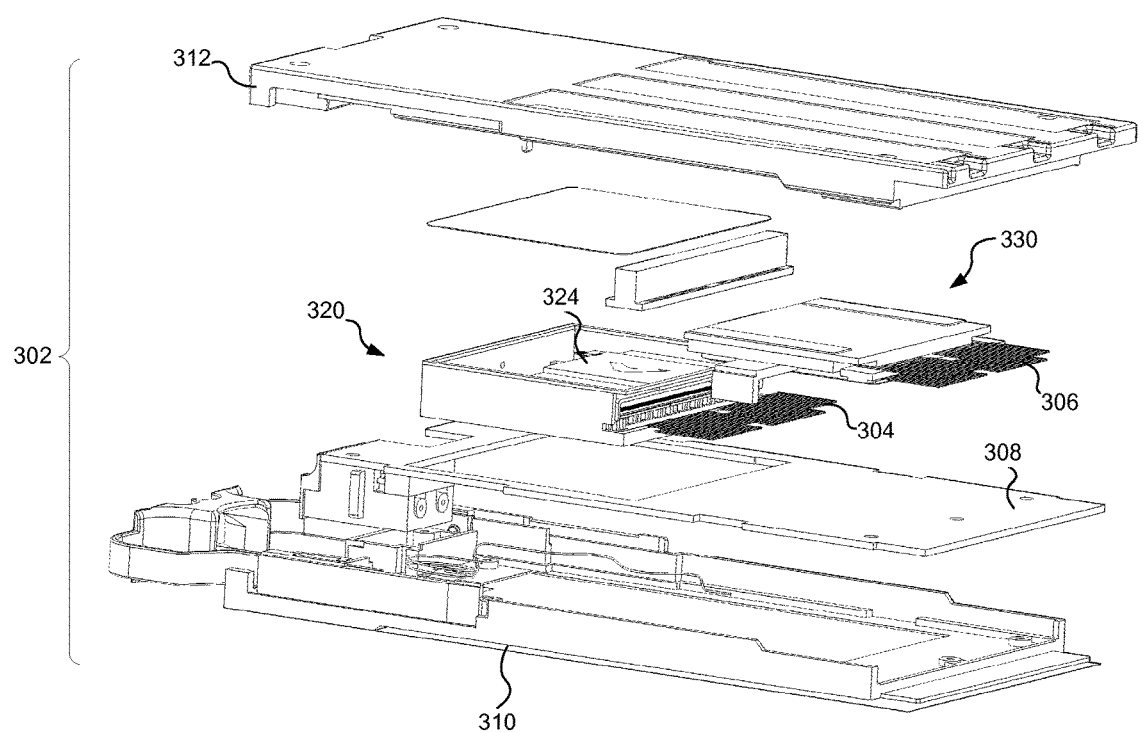
FIG. 3 is an exploded view of a multi-channel optical transceiver including a temperature controlled multi-channel TOSA package with temperature monitoring, consistent with an embodiment of the present disclosure.

Referring to FIG. 3, one embodiment of a multi-channel optical transceiver module 302 including a temperature controlled multi-channel TOSA package 320 is shown and described in greater detail. As discussed above, multiple multi-channel transceiver modules may be used in an OLT of a WDM-PON to cover a desired channel range. The transceiver module 302 and the multi-channel TOSA package 320 within the transceiver module 302 may thus be designed to have a relatively small form factor with minimal space. The multi-channel optical transceiver module 302 generally provides an optical input and output at one end and electrical input and output at another end. The transceiver module 302 includes a transceiver housing 310 containing the multi-channel TOSA package 320 and a multi-channel ROSA package 330.

The multi-channel TOSA package 320 includes an array of lasers (not shown in FIG. 3) coupled to an AWG 324. A temperature control system, as will be described in greater detail below, controls the temperature of the individual lasers to provide a desired wavelength with a desired wavelength precision or accuracy. In one example, the temperature of each laser is maintained within ±0.5° C. in the operating range between −5 and 70° C. to maintain a wavelength precision or accuracy of about ±0.05 nm. The temperature control system may control the temperature by raising or lowering the local temperatures of individual lasers in response to the monitored temperatures as described above.

The transceiver module 302 may also include one or more printed circuit boards 308 coupled to the TOSA package 320 and/or ROSA package 330. The printed circuit board(s) 308 may include circuitry and electronic components such as laser drivers, transimpedance amplifiers (TIAs), control interfaces, and temperature control circuitry. The TOSA package 320 is coupled to conductive leads 304 for carrying the electronic signals including the data to be transmitted by the TOSA. The ROSA package 330 is coupled to conductive leads 306 for carrying the electronic signals including the data received by the ROSA package 330. A top housing portion 312 encloses the TOSA package 320, the ROSA package 330, and other components within the housing 310.

Figure 4:
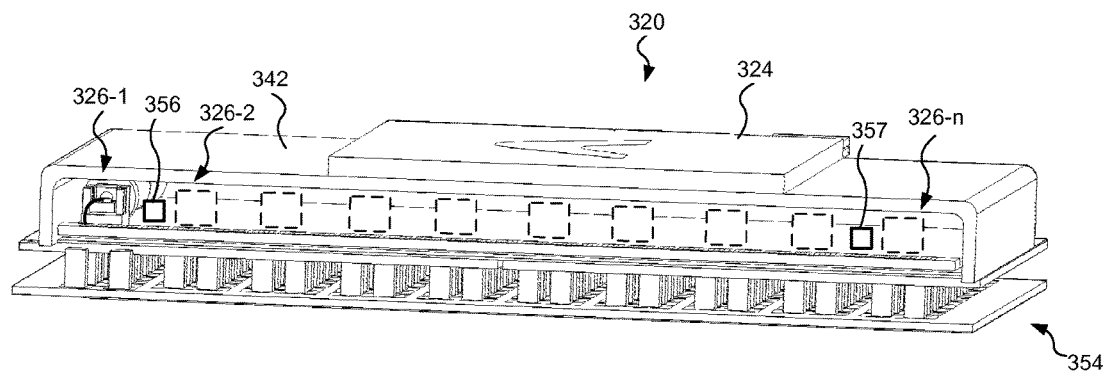
FIG. 4 is an end perspective view of one embodiment of a multi-channel TOSA package with temperature monitoring, consistent with an embodiment of the present disclosure.
Figure 5:
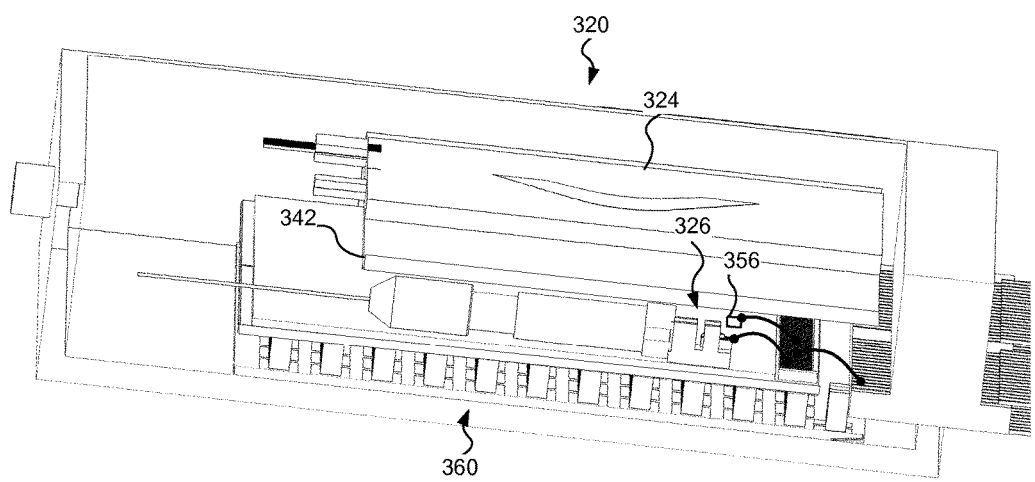
FIG. 5 is a side perspective view of the multi-channel TOSA package shown in FIG. 4.

Referring to FIGS. 4 and 5, an embodiment of the temperature controlled multi-channel TOSA package 320 is described in greater detail. The temperature monitoring and control system and method described herein may also be used in other embodiments of a multi-channel TOSA. This embodiment of the temperature controlled multi-channel TOSA package 320 includes the AWG 324 optically coupled to an array of laser packages 326-1 to 326-*n* (only laser package 326-1 is shown in detail), for example, using low bending loss optical fibers. The AWG 324 may include an AWG chip such as the type used for WDM, Coarse WDM (CWDM), or Dense (DWDM) multiplexing or demultiplexing.

Figure 6:
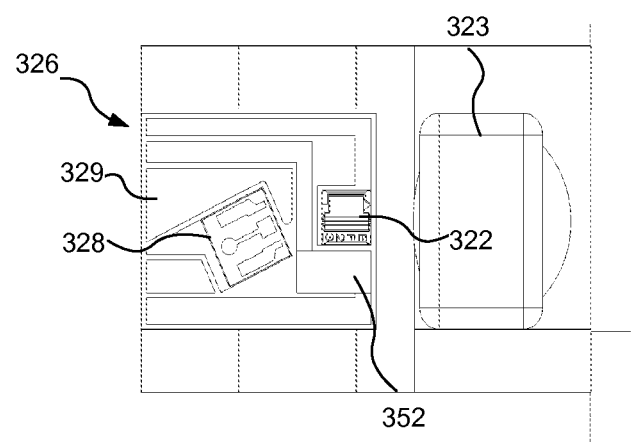
FIG. 6 is a top view of one embodiment of a laser package used in a multi-channel TOSA package, consistent with an embodiment of the present disclosure.

As shown in greater detail in FIG. 6, each laser package 326 includes a laser diode chip 322 (e.g., a DFB laser diode chip) mounted on a sub-mount 329. A monitor photodiode 328 may also be mounted on the sub-mount 329 to monitor light emitted from the laser diode chip 322. A heater 352, such as a resistor, may be located adjacent the laser diode chip 322 for heating the laser diode chip 322. The laser diode chip 322, the monitor photodiode 328, and the heater 352 may be wire bonded to conductive paths, as shown in FIG. 5, for providing electrical connections to circuitry outside the TOSA package 320. The laser package 326 may also include a lens 323, for example, to focus emitted laser light into an optical fiber or waveguide for optically coupling the laser diode 322 to the AWG 324.

In this embodiment, the laser packages 326-1 to 326-*n* are supported on and thermally coupled to at least one thermoelectric cooler (TEC) 354, such as a Peltier device, for cooling the laser packages 326-1 to 326-*n*. The AWG 324 is supported on an AWG tray 342 above the laser packages 326-1 to 326-*n*, and the AWG tray 342 may also be thermally coupled to the TEC 354 for cooling the AWG 324. Other embodiments of a multi-channel TOSA may also use different structures to support the lasers and/or AWG.

First and second temperature sensors 356, 357, such as thermistors, are located within the TOSA package 320 at locations proximate the first laser package 326-1 and the last laser package 326-*n*. The temperature sensors 356, 357 may be mounted to the same surface as the laser packages or to other structures (e.g., to the AWG tray 342 or to the laser package). In the illustrated embodiment, the first temperature sensor 356 is located between the first two laser packages and the second temperature sensor 357 is located between the last two laser packages. The temperature sensors 356, 357 may also be located in other locations provided that the first and second temperature measurements are capable of being used to determine a temperature tilt across the laser array. The temperature sensors 356, 357 may be wire bonded to conductive paths to provide an electrical connection to circuitry outside of the TOSA package 320.

The temperatures sensors 356, 357 may thus be used to sense the temperature at first and second locations within the TOSA package 320 and to determine a temperature tilt across the array of laser packages 326-1 to 326-*n* within the TOSA package 320. The heaters 352 within the laser packages 326-1 to 326-*n* and the TEC 354 may then be used to adjust the temperatures at different locations within the TOSA package 320 in response to estimated temperatures determined from the temperature tilt, as described above.

Accordingly, systems and methods, consistent with embodiments described herein, allow temperature to be monitored across a laser array within a TOSA package having a non-uniform temperature distribution and without requiring temperature sensors at each of the laser locations within the laser array.

Consistent with an embodiment, a method is provided for monitoring and controlling temperature of a laser array in a multi-channel transmitter optical subassembly (TOSA) package. The method includes: sensing at least first and second temperatures at first and second locations within the TOSA package proximate at least first and second ends of the laser array; determining a temperature tilt across the laser array and within the TOSA package, wherein the temperature tilt represents a change in temperature as a function of distance; determining, from the temperature tilt, an estimated local temperature at at least a third location along the laser array; and adjusting a temperature proximate the third location along the laser array in response to the estimated temperature.

Consistent with another embodiment, a temperature controlled multi-channel transmitter optical subassembly (TOSA) package includes a TOSA housing, a laser array located in the TOSA housing and configured to generate laser light associated with a plurality of optical channels, and an optical multiplexer located in the TOSA housing and optically coupled to the laser array. The optical multiplexer is configured to combine the laser light at different respective channel wavelengths. The TOSA package also includes at least first and second temperature sensors located in the TOSA housing at first and second locations proximate at least first and second ends of the laser array. The first and second temperature sensors are configured to sense at least first and second temperatures at the first and second locations. The TOSA package further includes temperature control devices located in the TOSA housing and thermally coupled to the laser array for adjusting temperatures at different locations along the laser array. The temperature control devices are configured to adjust the temperature proximate at least a third location along the laser array in response to an estimated temperature at the third location. The estimated temperature is estimated from a temperature tilt determined from the first and second temperatures at the first and second locations.

Consistent with a further embodiment, a multi-channel transceiver module includes a transceiver housing and at least one temperature controlled multi-channel transmitter optical subassembly (TOSA) package located in the transceiver housing. The TOSA package is configured to transmit a wavelength division multiplexed (WDM) optical signal on multiple channel wavelengths. The TOSA package includes a TOSA housing, a laser array located in the TOSA housing and configured to generate laser light associated with a plurality of optical channels, and an optical multiplexer located in the TOSA housing and optically coupled to the laser array. The optical multiplexer is configured to combine the laser light at different respective channel wavelengths. The TOSA package also includes at least first and second temperature sensors located in the TOSA housing at first and second locations proximate at least first and second ends of the laser array. The first and second temperature sensors are configured to sense at least first and second temperatures at the first and second locations. The TOSA package further includes temperature control devices located in the TOSA housing and thermally coupled to the laser array for adjusting temperatures at different locations along the laser array. The transceiver module also include a temperature control system configured to determine a temperature tilt from the first and second temperatures sensed at the first and second locations and to determine at least one estimated temperature at at least a third location along the laser array. The temperature control devices are configured to adjust the temperature proximate the third location along the laser array in response to the at least one estimated temperature. The transceiver module further includes at least one multi-channel receiver optical subassembly (ROSA) located in the transceiver housing. The ROSA is configured to receive a wavelength division multiplexed (WDM) optical signal on multiple channel wavelengths.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A method for monitoring and controlling temperature of a laser array in a multi-channel transmitter optical subassembly (TOSA) package, the method comprising:
sensing at least first and second temperatures at first and second locations within the TOSA package proximate at least first and second ends of the laser array;
determining a temperature tilt across the laser array and within the TOSA package, wherein the temperature tilt represents a change in temperature as a function of distance;
determining, from the temperature tilt, an estimated local temperature at at least a third location along the laser array; and
adjusting a temperature proximate the third location along the laser array in response to the estimated temperature.

2. The method of claim 1 wherein the laser array includes a plurality of lasers and the at least a third location is proximate at least one of the lasers, and wherein adjusting the temperature includes heating the at least one of the lasers proximate the third location with a heater adjacent the at least one of the lasers.

3. The method of claim 2 wherein the heater includes a resistor, and wherein adjusting the temperature include adjusting a current applied to the resistor.

4. The method of claim 1 wherein the laser array includes a plurality of lasers and the at least a third location is proximate at least one of the lasers, and wherein adjusting the temperature includes cooling the at least one of the lasers.

5. The method of claim 4 wherein the at least one of the lasers is cooled with a thermoelectric cooler (TEC).

6. The method of claim 1 wherein the temperature is adjusted at the at least a third location for tuning a laser proximate the third location to emit a desired channel wavelength.

7. The method of claim 1, wherein sensing at least first and second temperatures includes receiving signal from at least first and second thermistors located at the first and second locations.

8. The method of claim 1, wherein the laser array includes a plurality of tunable distributed feedback (DFB) lasers coupled to an arrayed waveguide grating (AWG).

9. The method of claim 1, wherein the laser array includes a plurality of gain regions coupled to an arrayed waveguide grating (AWG) forming an array of external cavity lasers.

* * * * *